(12) United States Patent
Hino et al.

(10) Patent No.: US 6,373,709 B1
(45) Date of Patent: Apr. 16, 2002

(54) FLEXIBLE WIRING BOARD

(75) Inventors: Atsushi Hino; Hitoshi Ishizaka, both of Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/556,123

(22) Filed: Apr. 20, 2000

(30) Foreign Application Priority Data

Apr. 21, 1999 (JP) .......................................... 11-113012

(51) Int. Cl.[7] .................................................. H05K 1/00
(52) U.S. Cl. ..................... 361/749; 361/749; 361/736; 361/737; 361/776; 361/777; 361/778; 174/52.4
(58) Field of Search ................................ 361/749, 737, 361/736, 776–778; 174/52.4

(56) References Cited

U.S. PATENT DOCUMENTS 5,834,704 A * 11/1998 Tanaka ........................ 174/254

FOREIGN PATENT DOCUMENTS

JP 9-223304 8/1997

* cited by examiner

Primary Examiner—Jayprakash N. Gandhi
Assistant Examiner—Thanh Phan
(74) Attorney, Agent, or Firm—Kubovcik & Kubovcik

(57) ABSTRACT

A flexible wiring board that can bridge wires and also can prevent production of conductive foreign materials in use, to secure good performance of a magnetic head. The flexible wiring board for connecting therethrough a suspension substrate having mounted thereon a magnetic head of a hard disk drive and a control circuit substrate for actuating the magnetic head includes a short-circuit forming portion for forming a shorting portion for bridging wires to prevent electrostatic destruction of the magnetic head; and a cut for removing the shorting portion. When the flexible wiring board is cut along the cut, the shorting portion can be removed without producing conductive foreign material resulting from the cutting off of the shorting portion.

3 Claims, 6 Drawing Sheets

FLEXIBLE WIRING BOARD

BACKGROUND OF THE INVENTION

1. Technical Field of the Invention

The present invention relates to a flexible wiring board and, more particularly, to a flexible wiring board for connecting therethrough a suspension substrate for mounting thereon a magnetic head of a hard disk drive and a control circuit substrate for actuating the magnetic head.

2. Description of the Prior Art

A readable and writable magnetic head is mounted on the hard disk drive used as a magnetic storage device of a computer. For example, a MR head (a magneto resistive head) and the like are being used as the magnetic head. With further increased speedup, high-density and high-capacity being increasingly desired for the hard disk drive in these years, the use of a thinner and higher density GMR head (giant magneto resistive head) is being anticipated.

Illustrated in FIG. 7 is a principal structure of the hard disk drive mounting this magnetic head thereon. In FIG. 7, the hard disk drive 1 comprises a magnetic disk 2 that rotates at high velocity revolution, a magnetic head 3 disposed in opposition to the magnetic disk 2, a suspension substrate 4 on which the magnetic head 3 is mounted, a carriage 5 on which the suspension substrate 4 is mounted, a control circuit substrate 6, located near the carriage 5, for actuating the magnetic head 3, and a flexible wiring board 7 mounted on the carriage 5 to extend along the longitudinal direction thereof The suspension substrate 4, which is formed of a resilient board of e.g. stainless steel, has thereon a predetermined circuit pattern to be connected with the magnetic head 3 and carries thereon the magnetic head 3 with a very small gap kept against the magnetic disk 2.

The carriage 5 is attached to the suspension substrate 4 at the tip end portion thereof and is rotatably supported at the base end portion thereof. The horizontal swinging motion of the carriage 5 allows the magnetic head 3 to read and write data at any selected radial position on the magnetic disk 2.

The flexible wiring board 7, which is mounted on the carriage 5 to extend along the longitudinal direction thereof, is connected to the suspension substrate 4 mounted on the tip end portion of the carriage 5 and the control circuit substrate 6 disposed in proximity of the base end portion so that read/write signals from the control circuit substrate 6 can be transmitted to the magnetic head 3.

Shown in FIG. 8 is such a flexible wiring board 7 for connecting therethrough the suspension substrate 4 and the control circuit substrate 6. In FIG. 8, the flexible wiring board 7 is formed as a thin strap-like flat cable and a predetermined circuit pattern is formed in an insulating layer 8. Wires 9 are formed in the insulating layer 8 to extend in parallel along the longitudinal direction of the flexible wiring board 7. Suspension substrate side electrical contacts 10 to be connected with the suspension substrate 4 are formed in association with the respective wires 9 at one end of the wires 9. Control circuit substrate side electrical contacts 11 to be connected with the control circuit substrate 6 are formed in association with the respective wires 9 at the other ends of the wires 9.

When the flexible wiring board 7 is shipped and transported as merchandise, there sometimes arises the occasion that static electricity is generated in the flexible wiring board 7 by friction from vibrations and the like and is stored in the wires 9. If the flexible wiring board 7 in this condition is connected with the suspension substrate 4 having mounted thereon the magnetic head 3 at the assembly of the hard disk drive 1, there may arise a possible occasion that an unexpected voltage is applied to the magnetic head 3 due to an electric potential difference generated between the wires 9, to cause an electrostatic destruction of the magnetic head 3. In general, in order to prevent such an electrostatic destruction of the magnetic head 3, the wires 9 are bridged in advance through a shorting member so that electric potential between the wires 9 of the wiring can be equalized even when static electricity is generated during the shipment or transport. The shorting member bridging the wires 9 is cut off before use. To be more specific, in FIG. 8, the shorting member 12 bridges particularly two wires 9a and 9b, between which an electrostatic destruction of the magnetic head 3 may possibly be caused, by forming a soldering bump on each wire 9a, 9b and then flattening it out to bring those two wires into contact with each other. The shorting member 12 is cut off in the direction of arrows 13 before it is used for the assembly of the hard disk drive 1. It will be understood that the shorting member 12 may be formed with a wire interconnecting the wires 9.

However, when the shorting member is cut off before use, there arises a problem that chips of the solder or wire, i.e., conductive foreign materials, are produced and fly or run over the insulating layer to adhere to the magnetic head, and as such cannot ensure normal performance of the magnetic head.

Among others, the above-mentioned GMR head including delicate elements is low in dielectric strength and its normal performance may be hindered by even a small amount of foreign material.

To conform to high-performance and delicate magnetic heads which are being improved at an increasingly rapid rate in these years, development of a flexible wiring board that can allow the wires to be surely bridged to prevent the electrostatic destruction of the magnetic head and also can prevent production of conductive foreign materials involved in the cutting of the shorting member before use is now being anticipated.

It is the object of the present invention to provide a flexible wiring board that can surely bridge the wires and also can prevent production of conductive foreign materials in use, to secure good performance of the magnetic head.

SUMMARY OF THE INVENTION

The present invention is directed to a novel flexible wiring board for connecting therethrough a suspension substrate for mounting thereon a magnetic head of a hard disk drive and a control circuit substrate for actuating the magnetic head. The flexible wiring board of the present invention comprises a short-circuit forming portion for forming a shorting portion for bridging wires to prevent electrostatic destruction of the magnetic head; and a cut for removing the shorting portion.

With the flexible wiring board of the present invention thus arranged, the wires can surely be bridged, while also the shorting portion can be removed easily in use by simply cutting the flexible wiring board along the cut. Besides, since there is no need to cut off the shorting portion, as in the prior art, no conductive foreign material such as the chips of solder or wire is produced. As a result of this, the normal performance of the magnetic head is not hindered by such foreign material and therefore the good performance of the magnetic head can be well ensured.

Thus, the flexible wiring board of the present invention is effectively applicable to high-performance and delicate magnetic heads that are being improved at an increasingly rapid rate in these years.

It is preferable that the cut is formed so as to cut the flexible wiring board at a longitudinal part thereof.

With the arrangement in which the cut is formed so as to cut the flexible wiring board at a longitudinal part thereof, the shorting portion can easily be removed by simply folding the flexible wiring board at a longitudinal part thereof along the cut.

In addition, the cut is preferably formed in the form of a perforation bridging the wires in an insulating layer forming the wires therein.

With the arrangement in which the cut is formed in the form of a perforation, the flexible wiring board can surely and easily be cut along the perforation.

Also, the present invention provides a flexible wiring board for connecting therethrough a suspension substrate for mounting thereon a magnetic head of a hard disk drive and a control circuit substrate for actuating the magnetic head, the flexible wiring board comprising a suspension substrate side electrical contact forming portion, formed at one longitudinal end of the flexible wiring board, for connection with the suspension substrate; a control circuit substrate side electrical contact forming portion, formed in a longitudinal part of the flexible wiring board, for connection with the control circuit substrate; a short-circuit forming portion, formed at an outside of an area between the suspension substrate side electrical contact forming portion and the control circuit substrate side electrical contact forming portion with respect to a longitudinal direction of the flexible wiring board, for forming a shorting portion for bridging wires to prevent electrostatic destruction of the magnetic head; and a cut, formed between the control circuit substrate side electrical contact forming portion and the short-circuit forming portion, for removing the shorting portion.

Further, the present invention provides a flexible wiring board for connecting therethrough a suspension substrate for mounting thereon a magnetic head of a hard disk drive and a control circuit substrate for actuating the magnetic head, the flexible wiring board comprising a suspension substrate side electrical contact forming portion, formed at one longitudinal end of the flexible wiring board, for connection with the suspension substrate; a testing electrical contact forming portion, formed at the other longitudinal end of the flexible wiring board, for connection with a testing probe; a control circuit substrate side electrical contact forming portion, formed in a longitudinal part of the flexible wiring board, for connection with the control circuit substrate; a short-circuit forming portion, formed between the control circuit substrate side electrical contact forming portion and the testing electrical contact forming portion, for forming a shorting portion for bridging wires to prevent electrostatic destruction of the magnetic head; and a cut, formed between the control circuit substrate side electrical contact forming portion and the short-circuit forming portion, for removing the shorting portion.

According to the flexible wiring board of the present invention, the flexible wiring board can be divided into two parts i.e., a part to be used including the suspension substrate side electrical contact and the control circuit substrate side electrical contact and a part to be disused including the shorting portion and the testing electrical contact by simply cutting the flexible wiring board along the cut. This produces the result that the part to be disused including the shorting portion and the testing electrical contact which was already used for the testing can be removed at one time.

DESCRIPTION OF THE PREFERRED EMBODIMENT

In the following, the preferred embodiments of the present invention will be described with reference to the accompanying drawings.

Figure 1:
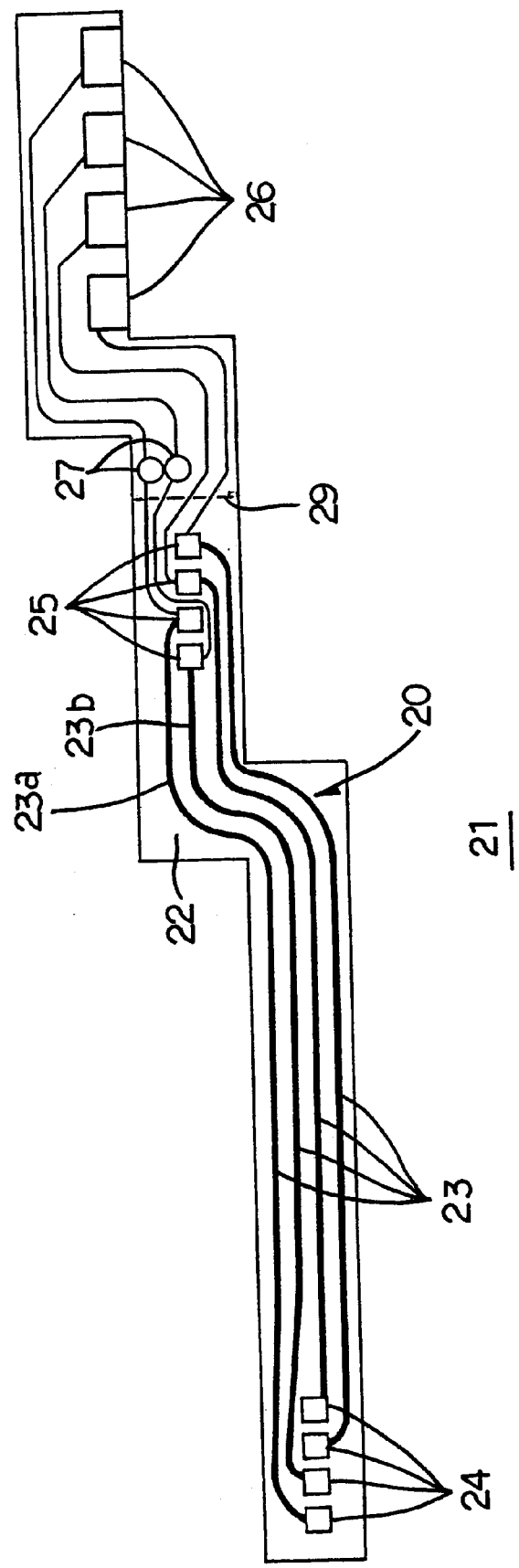
FIG. 1 is a plan view showing one embodiment of a flexible wiring board of the present invention.
Figure 7:
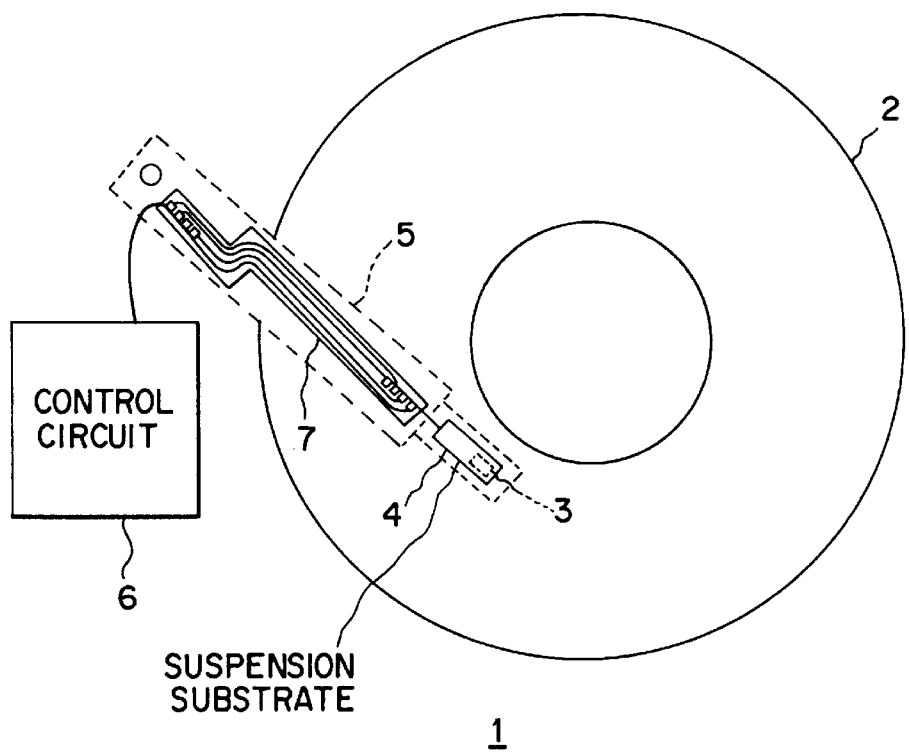
FIG. 7 is an illustration of a principal arrangement of a hard disk driver.
Figure 8:
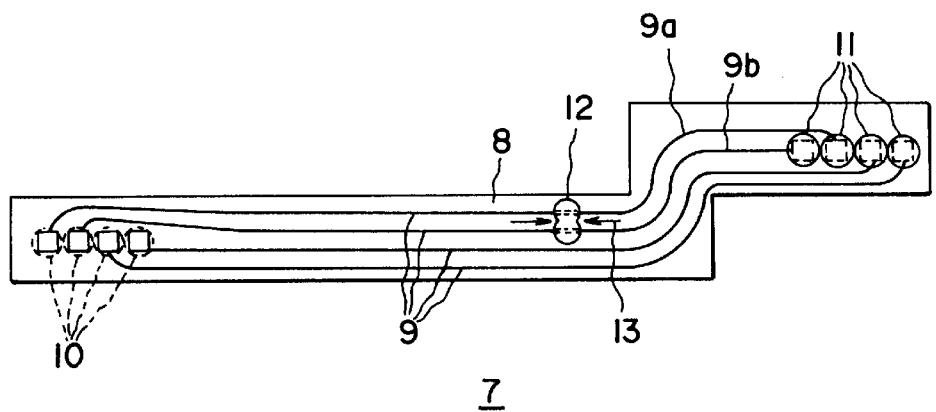
FIG. 8 is a plan view showing one embodiment of a conventional type flexible wiring board.

Referring to FIG. 1, there is shown a plan view showing one embodiment of a flexible wiring board of the present invention. In FIG. 1, the flexible wiring board 21 is used for connecting therethrough a suspension board 4 for mounting thereon a magnetic head 3 of a hard disk drive 1 and a control circuit board 6 for actuating the magnetic head 3, as previously described with reference to FIG. 7. Though the use condition of the flexible wiring board 21 of this embodiment is not shown in particular, the flexible wiring board 21 is used in the hard disk drive 1 shown in, for example, FIG. 7, in place of the conventional type flexible wiring board 7.

This flexible wiring board 21 is formed as a thin strap-like flat cable and a predetermined circuit pattern 20 is formed in an insulating layer 22. The flexible wiring board 21 has bent portions formed in a L-shaped crank-like form at two longitudinal locations. It will be understood that the bent portions may be formed into any desirable form to fit the purpose and application, without being limited to such a form.

The circuit pattern 20 comprises a plurality of wires 23 formed to extend in parallel along a longitudinal direction and bending directions of the flexible wiring board 21. The circuit pattern 20 also comprises suspension substrate side electrical contact forming portions 24, control circuit substrate side electrical contact forming portions 25, testing electrical contact forming portions 26 and short-circuit forming portions 27, all of which are formed respectively in parts of or at either end of the wires 23.

Specifically, the suspension substrate side electrical contact forming portions 24 to be connected with the suspension substrate 4 are formed in association with the respective wires 23 at one ends of the wires 23 on the flexible wiring board 21 at longitudinal end portion thereof. The testing electrical contact forming portions 26 to be connected with testing probes as mentioned later are formed in association with the respective wires 23 at the other ends of the wires 23 on the flexible wiring board 21 at the other longitudinal end portion thereof. Further, the control circuit substrate side electrical contact forming portions 25 to be connected with the control circuit substrate 6 are formed in association with the respective wires 23 in parts of the wires 23 extending longitudinally between the bent portions formed at the two locations of the flexible wiring board 21.

In addition, the short-circuit forming portions 27 for forming shorting portions 28 bridging the wires 23 so as to prevent the electrostatic destruction of the magnetic head 3, are formed between the bent portions formed at the two locations of the flexible wiring board 21 and between the control circuit substrate side electrical contact forming portions 25 and the testing electrical contact forming portions 26. The short-circuit forming portions 27 are each formed in the form of such a circular pattern so as to allow a soldering bump to be formed in parts of the two wires 23a and 23b, so that the two wires 23a and 23b, between which the electrostatic destruction of the magnetic head 3 may possibly be caused, are particularly bridged.

Figure 2:
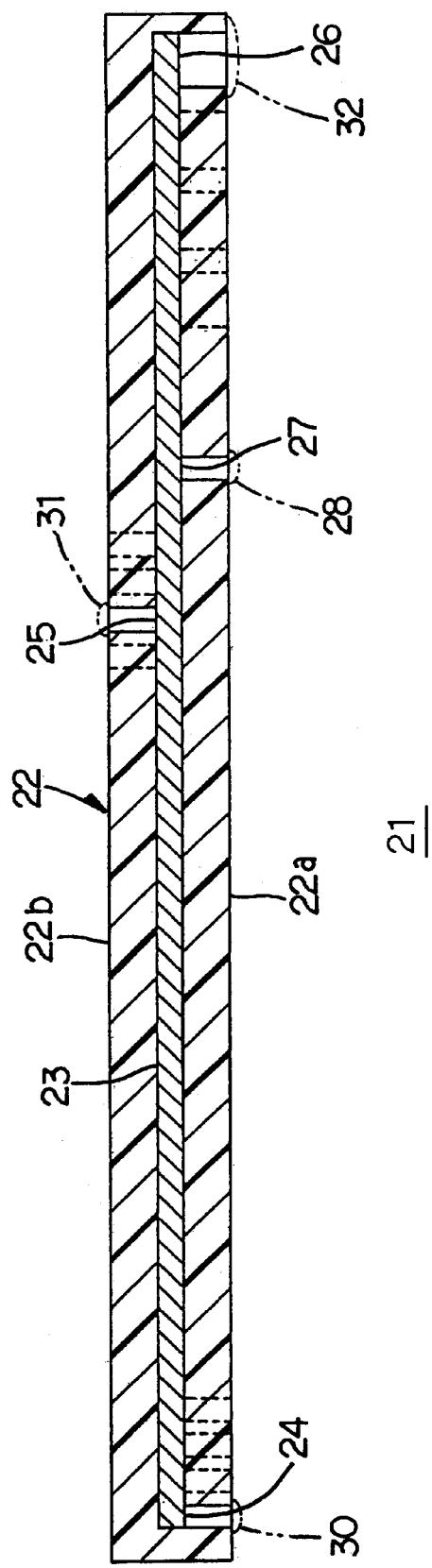
FIG. 2 is a sectional side elevation view of the flexible wiring board of FIG. 1 taken along a wire.

In the illustrated embodiment, as shown in FIG. 2 which is a sectional side elevation view taken along the wire 23a, the suspension substrate side electrical contact forming portions 24, the testing electrical contact forming portions 26 and the short-circuit forming portions 27 are formed to be exposed from one surface of the insulating layer 22, and the control circuit substrate side electrical contact forming portions 25 is formed to be exposed from the other surface of the insulating layer 22. It will be understood that from which surface the respective portions are to be exposed can selectively be determined in accordance with the purpose and application.

Figure 3:
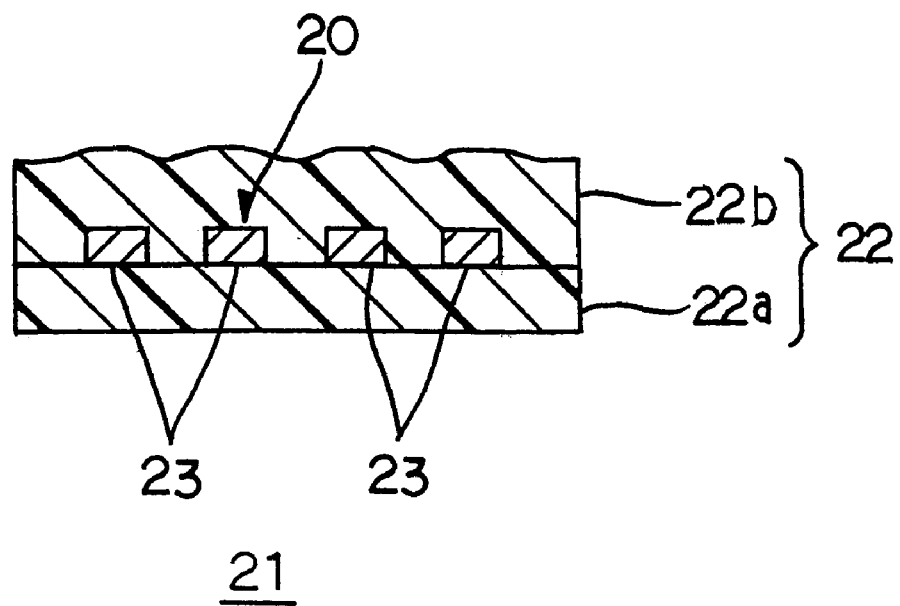
FIG. 3 is a longitudinal sectional view of the flexible wiring board shown in FIG. 1.

Next, the processes for producing the flexible wiring board 21 will be described in brief. When the circuit pattern 20 is formed in the insulating layer 22, the circuit pattern 20 is formed on a base layer 22a of the insulating layer 22 and then is covered with a cover layer 22b of the insulating layer 22. Specifically, the base layer 22a made of an insulating material, such as polyimide resin, is formed first and then a conductor layer made of e.g. copper, nickel, gold, solder or alloys thereof is laminated on the base layer 22a. Then, the conductor layer is patterned by a known process, such as an additive process or a subtractive process, to form thereon the circuit pattern 20 of conductor. Subsequently, the cover layer 22b made of an insulating material, such as polyimide resin, is laid over the circuit pattern 20. The state of the circuit pattern 20 thus formed is illustrated in FIG. 3, for example. In FIG. 3, the plurality of wires 23 forming the circuit pattern 20 are formed on the base layer 22a and covered with the cover layer 22b.

As shown in FIG. 2, the base layer 22a is opened in association with the respective wires 23 at its portions corresponding to the suspension substrate side electrical contact forming portions 24, the testing electrical contact forming portions 26 and the short-circuit forming portions 27, whereby the suspension substrate side electrical contact forming portions 24, the testing electrical contact forming portions 26 and the short-circuit forming portions 27 are exposed. Also, the cover layer 22b is opened in association with the respective wires 23 at its portions corresponding to the control circuit substrate side electrical contact forming portions 25, whereby the control circuit substrate side electrical contact forming portions 25 are exposed. Then, solder or gold bumps or plated electrical contacts are formed at the respective portions. The openings in the base layer 22a and the cover layer 22b are formed by a known process, such as a laser ablation process, a chemical etching process, or a plasma etching process, preferably by an ablation process using an ultraviolet laser.

The base layer 22a and the cover layer 22b have a thickness of 5–100 µm, preferably, 5–50 µm. The circuit pattern 20 has a thickness of 1–50 µm, preferably, 2–35 µm. A pitch between the wires 23 of the circuit pattern 20 (a width of each wire 23 itself plus a distance between the neighboring wires 23) is in the order of 10–300 µm. A usual pitch of the circuit pattern is in the order of 100 µm. A fine pitch of the circuit pattern is in the order of 20 µm.

In accordance with the purpose and application, the illustrated arrangement may be modified such that the circuit pattern 20 is only formed on the base layer 22a without forming the cover layer 22b.

Figure 4:
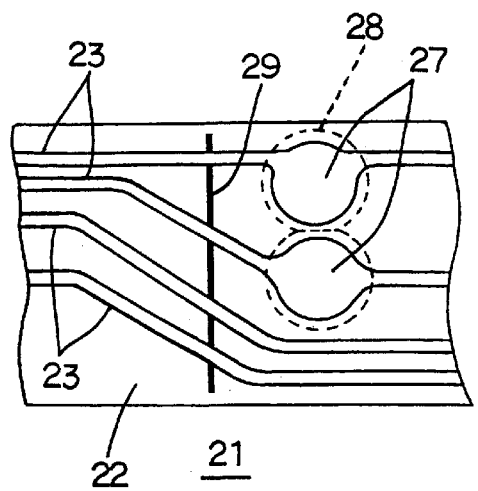
FIG. 4 is an enlarged view of a principal part of FIG. 1.

As shown in FIG. 1, according to the flexible wiring board 21 of the illustrated embodiment, there is provided a cut 29 used for removal of the shorting portions 28 formed on the short-circuit forming portions 27. Specifically, the cut 29 is formed between the bent portions formed at the two locations of the flexible wiring board 21 and between the control circuit substrate side electrical contact forming portions 25 and the short-circuit forming portions 27 (in other words, at the outside of an area between the suspension substrate side electrical contact forming portions 24 and the control circuit substrate side electrical contact forming portions 25), extending along the direction orthogonal to the longitudinal direction of the flexible wiring board 21. To be more specific, as shown in FIG. 4, the cut 29 is formed in the insulating layer 22 in the form of perforation bridging the wires 23 so that the flexible wiring board 21 can be cut at a longitudinal part thereof along the widthwise direction of the flexible wiring board 21. The cut 29 can be formed by use of, for example, an infrared laser such as a carbon dioxide laser or an ultraviolet laser. The carbon dioxide laser enables only the insulating layer 22 to be cut without cutting the wires 23, so that when the carbon dioxide laser is made to scan over the flexible wiring board 21 in the direction orthogonal to the longitudinal direction thereof, the perforation-like cut 29 is formed, along which part of the insulating layer 22 between the wires 23 is successively cut, as shown in FIG. 4. The ultraviolet laser enables the cut 29 to have a narrow width of the order of 10–15 µm and thus can produce substantially no chippage to thereby prevent the contamination of products.

Figure 5:
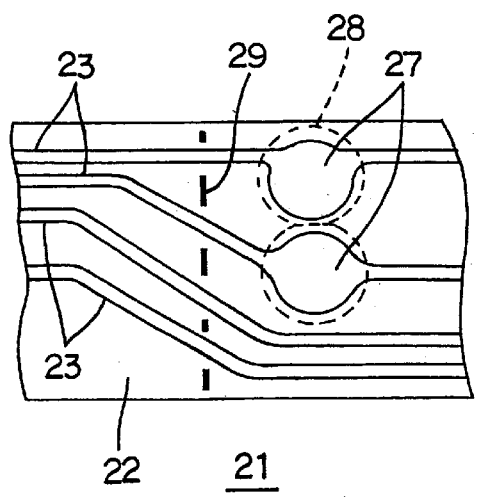
FIG. 5 is a view corresponding to FIG. 4, showing a cut of a different form.

The perforation-like cut 29 can be so formed as to cut the insulating layer 22 at only the centers between the wires 23, as shown in FIG. 5, by intermittently irradiating that portion of the insulating layer 22 with the infrared laser or the ultraviolet laser while scanning over it. The cut 29 shown in FIGS. 4 and 5 is formed at e.g. a location close to the short-circuit forming portions 27 (at a minimum distance of the order of 25 µm therefrom) with a width of the order of 10–25 µm.

This cut 29 can be formed by a known method, such as a die cutting, without limiting to the irradiation of the infrared laser and the ultraviolet laser. The cut 29 may be formed by perforating the insulating layer 22 or may alternatively be formed in the form of e.g. a V-shaped groove without perforating it.

In a certain process prior to the shipment, the solder or gold bumps or plated electrical contacts (which are illustrated as the suspension substrate side electrical contacts 30 and the control circuit substrate side electrical contacts 31 by a phantom line in FIG. 2, for example) are formed in the flexible wiring board 21 at the suspension substrate side electrical contact forming portions 24 and the control circuit substrate side electrical contact forming portions 25, respectively. Likewise, electrical contacts (which are illustrated as testing electrical contacts 32 by a phantom line in FIG. 2, for example) are formed at the testing electrical contact forming portions 26. The testing probes are connected with the testing electrical contacts 32 so that the conduction in the flexible wiring board 21 is tested. On the other hand, the soldering bumps are formed and then flattened out at the short-circuit forming portions 27 so that they are brought into contact with each other to thereby form the shorting portions 28 for bridging the two wires 23a and 23b between which the electrostatic destruction of the magnetic head 3 may possibly be caused.

With this arrangement, even when static electricity is generated by friction resulting from vibrations and the like during the shipment or transport as merchandise and is stored in the respective wires 23, since the two wires 23a and 23b are bridged by the shorting portions 28, the electric potential between the wires 23a, 23b is always equalized. The flexible wiring board 21 is cut along the cut 29 at the longitudinal part to remove the part of the flexible wiring board 21 including the shorting portions 28 before use. As a result of this, when the suspension substrate side electrical contacts 30 and the suspension substrate 4 are connected with each other in the assembly of the hard disk drive 1, an unexpected voltage will not be applied to the magnetic head 3 mounted on the suspension substrate 4, so that the electrostatic destruction of the magnetic head 3 can effectively be prevented.

Figure 6:
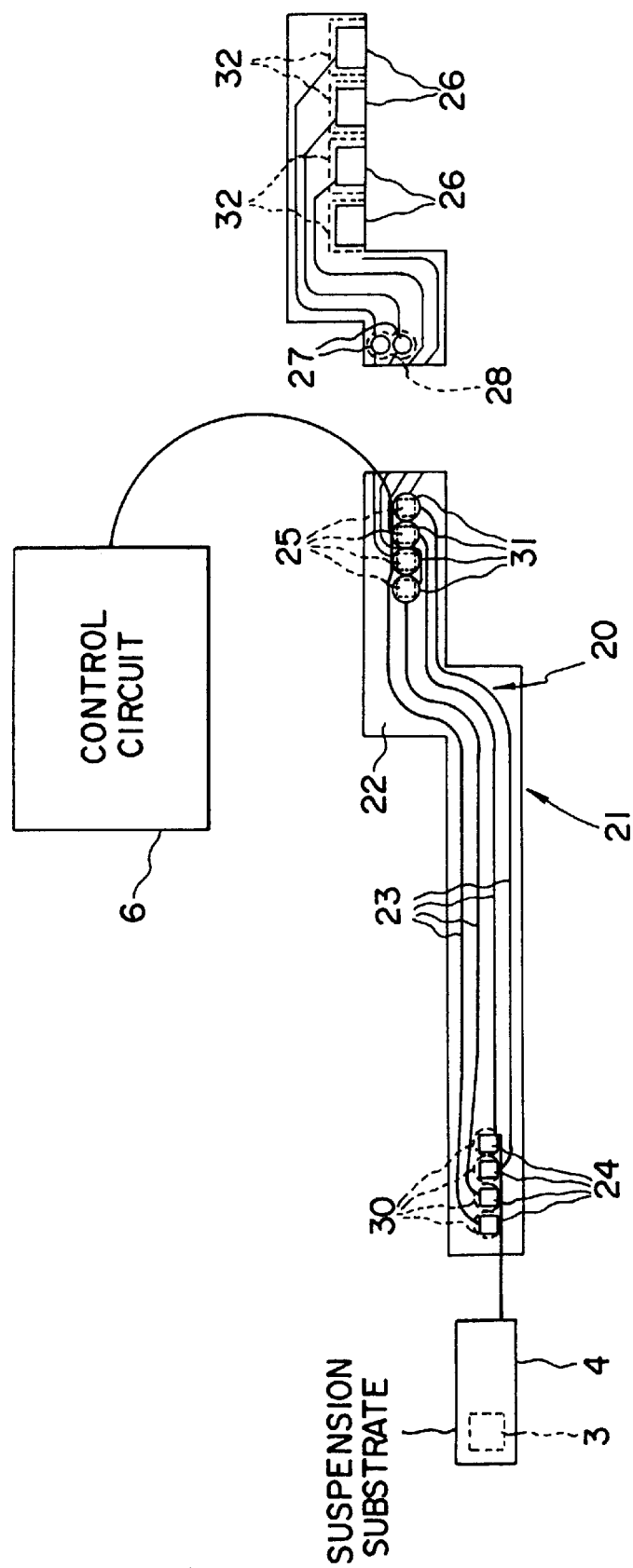
FIG. 6 is a plan view of the flexible wiring board in the state of being cut along the cut.

FIG. 6 shows the state of the flexible wiring board 21 being cut along the cut 29. When the flexible wiring board 21 is cut along the cut 29, it is divided into two parts, i.e., a part to be used including the suspension substrate side electrical contacts 30 and the control circuit substrate side electrical contacts 31 and a part to be disused including the shorting portions 28 and the testing electrical contacts 32, as shown in FIG. 6. FIG. 6 also shows the state in which the suspension substrate 4 is connected with the suspension substrate side electrical contacts 30 and the control circuit substrate 6 is connected with the control circuit substrate side electrical contacts 31.

Thus, with the arrangement of the flexible wiring board 21 of the illustrated embodiment, the part to be disused including the shorting portions 28 and the testing electrical contacts 32 which was already used for the testing can be removed at a time by simply folding the flexible wiring board 21 along the perforation at the cut 29. Besides, since there is no need to cut off the shorting portions 28, as in the prior art, no conductive foreign material such as the chips of solder is produced. As a result of this, the normal performance of the magnetic head 3 can be well ensured without being hindered by the foreign material. Thus, the flexible wiring board of the present invention is effectively applicable to high-performance and delicate magnetic heads 3 that are being improved at an increasingly rapid rate in these years.

While, in the illustrated embodiment, the cut 29 is formed so as to extend in the direction orthogonal to the longitudinal direction of the flexible wiring board 21, it can take any desirable form without limiting to the illustrated form, as long as it is formed so as to remove the shorting portions 28. For example, the cut 29 may be formed so as to extend obliquely with respect to the longitudinal direction of the flexible wiring board 21 or it may be formed in a semicircular form or in a U-shaped form so as to extend around the shorting portions 28. Also, the cut 29 may be formed into any cutting form that can cut the insulating layer 22, without being limited to the perforated form. Further, the shorting portions 28 may be formed by a known shorting process using e.g. a wire bridging the wires 23, instead of the soldering bump as in the illustrated embodiment. In addition, any number of bridging wires and locations may properly be selected in accordance with the purpose and application.

While the illustrative embodiments of the present invention are provided in the above description, such is for illustrative purpose only and it is not to be construed restrictively. Modification and variation of the present invention that will be obvious to those skilled in the art is to be covered in the following claims.

What is claimed is:

1. A flexible wiring board which is adapted to be connected to (1) a suspension substrate having mounted thereon a magnetic head of a hard disk drive and (2) a control circuit substrate for actuating said magnetic head, said flexible wiring board comprising:

an insulating layer;

a predetermined circuit pattern of wires formed in said insulating layer and extending in parallel along a longitudinal direction of the flexible wiring board;

a shorting member formed in said flexible wiring board and bridging wires of said predetermined circuit pattern to prevent electrostatic destruction of said magnetic head; and a cut in the form of a perforation bridging said wires and formed in said insulating layer along a widthwise direction of the flexible wiring board for removing a portion of said flexible wiring board having said shorting member formed therein.

2. A flexible wiring board which is adapted to be connected to (1) a suspension substrate having mounted thereon a magnetic head of a hard disk drive and (2) a control circuit substrate for actuating said magnetic head, said flexible wiring board comprising:

an insulating layer;

a predetermined circuit pattern of wires formed in said insulating layer and extending in parallel along a longitudinal direction of the flexible wiring board;

a first electrical contact portion, formed at one longitudinal end of said flexible wiring board, for connection with said suspension substrate;

a second electrical contact portion, formed in a longitudinal part of said flexible wiring board, for connection with said control circuit substrate;

a shorting member, formed in said flexible wiring board outside of an area between said first electrical contact portion and said second electrical contact portion with respect to a longitudinal direction of said flexible wiring board, said shorting member bridging wires of said predetermined circuit pattern to prevent electrostatic destruction of said magnetic head;

and a cut formed in said insulating layer between second electrical contact portion and said shorting member, for removing said shorting member.

3. A flexible wiring board which is adapted to be connected to (1) a suspension substrate having mounted thereon a magnetic head of a hard disk drive and (2) a control circuit substrate for actuating said magnetic head, said flexible wiring board comprising:

an insulating layer;

a predetermined circuit pattern of wires formed in said insulating layer and extending in parallel along a longitudinal direction of the flexible wiring board;

a first electrical contact portion, formed at one longitudinal end of said flexible wiring board, for connection with said suspension substrate;

a testing electrical contact portion, formed at the other longitudinal end of said flexible wiring board, for connection with a testing probe;

a second electrical contact portion, formed in a longitudinal part of said flexible wiring board, for connection with said control circuit substrate;

a shorting member, formed between said second electrical contact portion and said testing electrical contact portion, said shorting member bridging wires of said predetermined circuit pattern to prevent electrostatic destruction of said magnetic head;

and a cut formed in said insulating layer between said second electrical contact portion and said shorting member, for removing said shorting member.

* * * * *